US006661658B2

(12) United States Patent
Capriz et al.

(10) Patent No.: US 6,661,658 B2
(45) Date of Patent: Dec. 9, 2003

(54) FLUID-COOLED HEAT SINK FOR ELECTRONIC COMPONENTS

(75) Inventors: Cesare Capriz, Bologna (IT); Luca Rossi, Bologna (IT)

(73) Assignee: Aavid Thermalloy, LLC, Concord, NH (US)

( * ) Notice: Subject to any disclaimer, the term of this patent is extended or adjusted under 35 U.S.C. 154(b) by 0 days.

(21) Appl. No.: 10/121,337

(22) Filed: Apr. 12, 2002

(65) Prior Publication Data

US 2002/0167795 A1 Nov. 14, 2002

(30) Foreign Application Priority Data

Apr. 27, 2001 (IT) .................................. BO200100258

(51) Int. Cl.[7] ................................................ H05K 7/20
(52) U.S. Cl. ........................ 361/690; 361/698; 361/699; 361/704; 257/706; 257/707; 257/714; 174/15.1; 165/80.4; 165/104.33; 165/177
(58) Field of Search ................................. 361/689, 690, 361/699, 700, 709, 710, 711; 257/713, 714; 174/15.1, 15.2; 165/80.4

(56) References Cited

U.S. PATENT DOCUMENTS

| 4,962,444 A | * | 10/1990 | Niggemann | .................. | 361/702 |
| 5,179,500 A | * | 1/1993 | Koubek et al. | .............. | 361/700 |
| 5,504,378 A | * | 4/1996 | Lindberg et al. | ............ | 307/10.1 |
| 5,562,156 A | | 10/1996 | Ogawa et al. | ............... | 165/133 |
| 5,576,932 A | * | 11/1996 | Bishop et al. | ............... | 361/697 |
| 5,666,269 A | * | 9/1997 | Romero et al. | .............. | 361/699 |
| 5,697,428 A | * | 12/1997 | Akachi | ................... | 165/104.21 |
| 5,937,936 A | * | 8/1999 | Furukawa et al. | ...... | 165/104.33 |
| 6,257,320 B1 | * | 7/2001 | Wargo | ......................... | 165/80.4 |
| 6,269,866 B1 | * | 8/2001 | Yamamoto et al. | .... | 165/104.26 |
| 6,296,048 B1 | * | 10/2001 | Sauer | .......................... | 165/80.3 |
| 6,388,317 B1 | * | 5/2002 | Reese | ........................... | 257/713 |

FOREIGN PATENT DOCUMENTS

JP           405152475 A  *  6/1993  .................. 257/714

* cited by examiner

*Primary Examiner*—Boris Chervinsky
(74) *Attorney, Agent, or Firm*—Cohen, Pontani, Lieberman & Pavane

(57) ABSTRACT

A fluid-cooled heat sink for electronic components includes a first metal plate designed to be positioned in contact with at least one electronic component and a second plate having a first face and a second face. The first face of the second plate is joined to the first plate. The first face of the second plate has a groove formed therein for accommodating a cooling liquid. The first face and the second face of the second plate are parallel at least along the length of the groove.

16 Claims, 2 Drawing Sheets

FLUID-COOLED HEAT SINK FOR ELECTRONIC COMPONENTS

BACKGROUND OF THE INVENTION

1. Field of the Invention

The present invention relates to a fluid-cooled heat sink for electronic components and a process for making the heat sink.

2. Description of the Related Art

As is well known, heat sinks are devices used to lower the temperature of electronic components and circuits by dissipating the heat these components and circuits produce during operation.

Heat sinks may be of the liquid-cooled type. These are also known as liquid cooling plates and are used when the heat transfer system is required to be much more efficient than systems based on air cooling, whether by natural or forced convection.

Liquid-cooled heat sinks usually include a dissipating element through which a cooling liquid is passed so that the liquid comes into contact with the electronic component to be cooled. The heat transferred from the component to the dissipating element is absorbed by the flowing liquid which carries it away. Liquid-cooled heat sinks known to prior art may comprise a single plate-like element made of a highly conductive material, usually metal. The plate has a plurality of through holes made in it with a precision tool. The holes are made in several directions to create a network of intersecting channels. The ends of most of the holes are then sealed to form a path through which the cooling liquid is made to pass.

Besides heat sinks of this type, there are also liquid-cooled heat sinks made, for example, by embedding a set of coil-shaped metal tubes, in a metal plate having a set of matching milled grooves to receive them. Lastly, there are heat sinks consisting of an aluminium or copper plate, in which the grooves are milled, and a cover positioned over the plate and sealed by gluing, brazing or screwing.

All the heat sinks mentioned above are made by removing material using precision machine processes. The manufacturing of heat sinks of this kind involves considerably complex processes. Indeed, these precision processes require the use of complex numerically controlled machines operated by skilled personnel. Also, the number of pieces made per unit time is limited and production speed is limited since each component must be machined individually. Moreover, machine processes where material is removed result in a large amount of waste material which cannot be re-used in the production cycle.

Prior art also teaches the use of extrusion to make a liquid-cooled heat sink comprising a single dissipating plate made by extrusion and having a set of parallel through holes. The holes are then sealed and the channels joined at defined points to form a path for the cooling fluid. This method of making heat sinks of this type also has disadvantages. The material sliding against the sides of the extrusion matrix may cause scoring which leads to loss of essential mechanical properties. This means that the extrusion process must be closely controlled. Special attention must be given to the temperature of the material and the extrusion rate, that is to say, the speed at which the extruded product feeds out of the matrix. The production speed is therefore limited not only by the speed of the extrusion process but also by the fact that each single part must be machined individually to seal the holes to make the path for the cooling liquid. Thus, in this case, too, the process does not lend itself to large series production.

SUMMARY OF THE INVENTION

The present invention therefore has for an aim to overcome the above mentioned disadvantages.

The invention has for an aim, in particular, to provide a fluid-cooled heat sink that can be entirely series-produced without requiring individual machining by skilled personnel on one or more of its parts.

Another aim of the present invention is to provide a fluid-cooled heat sink that is easy to make.

Yet another aim of the present invention is to provide a fast and economical process to make heat sinks of the type mentioned above.

The above-mentioned technical need and aims are substantially fulfilled by a fluid-cooled heat sink comprising a first metal plate having a first face and a second face; the first metal plate being associated to at least one electronic component at least along the first face, a second plate having a first face and a second face, the first face of the second plate being joined to the second face of the first plate, at least one groove for a cooling fluid made in the first face of the second plate; means of connection between the first plate and the second plate. This heat sink is characterized in that the first face and the second face of the second plate are parallel to each other at least along the length of the groove.

The above mentioned technical need is also accomplished by a process of forming a first metal plate having a first face and a second face, forming a second metal plate having a first face and a second face, forming in the second plate a groove through which a cooling liquid can pass, and joining the first face of the second plate to the second face of the first plate in such a way that the groove faces the first plate. The process is characterized in that the step of making the groove consists of forming the groove on the second plate by plastic deformation.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference numerals represent similar elements throughout the several views.

DETAILED DESCRIPTION OF THE PRESENTLY PREFERRED EMBODIMENTS

Figure 1:
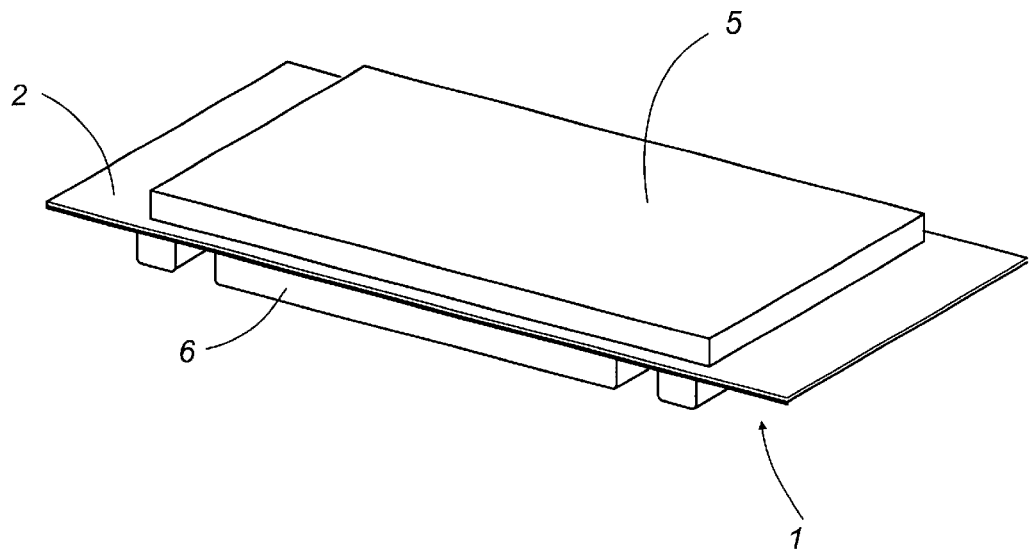
FIG. 1 illustrates in a perspective view a fluid-cooled heat sink according to the invention, associated to an electronic component.
Figure 2:
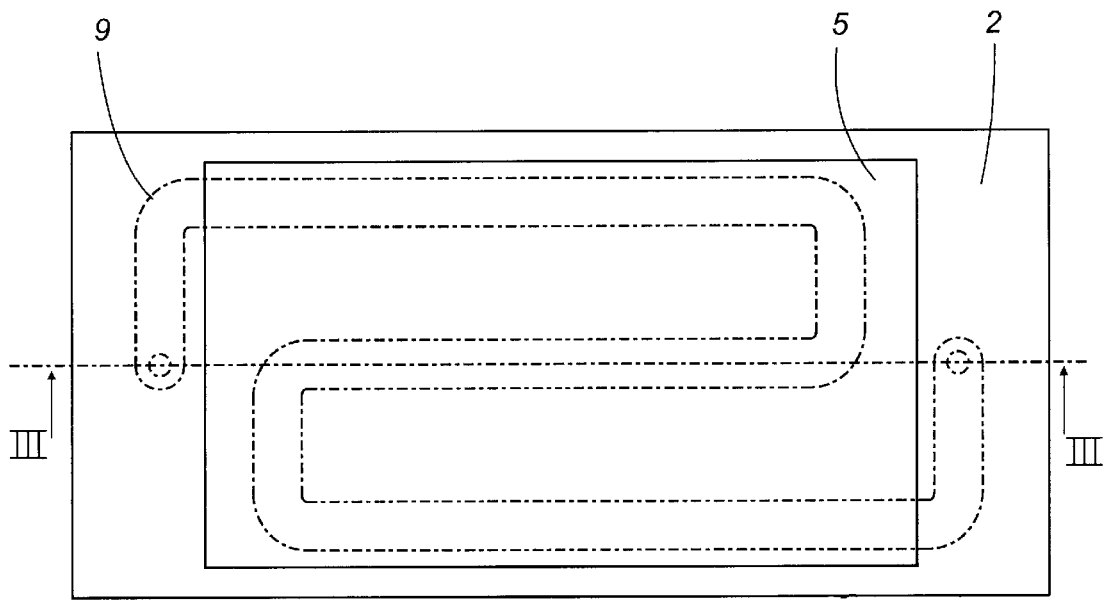
FIG. 2 is a plan view of the device shown in FIG. 1.
Figure 3:
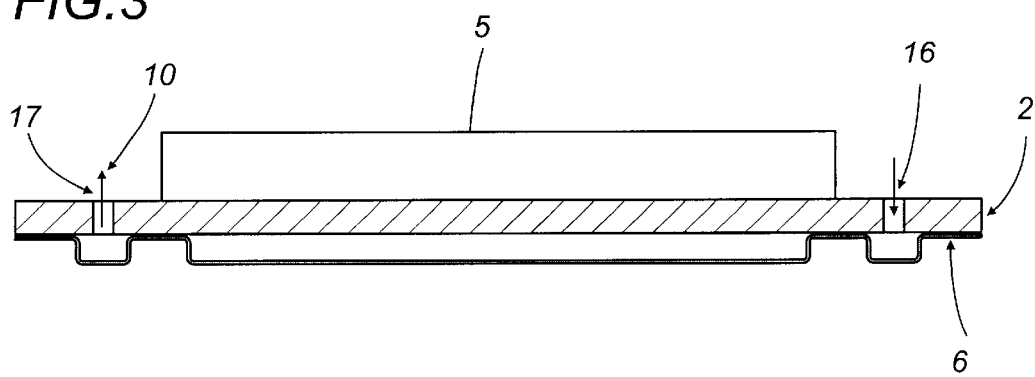
FIG. 3 is a cross section through line III—III of FIG. 2.
Figure 4:
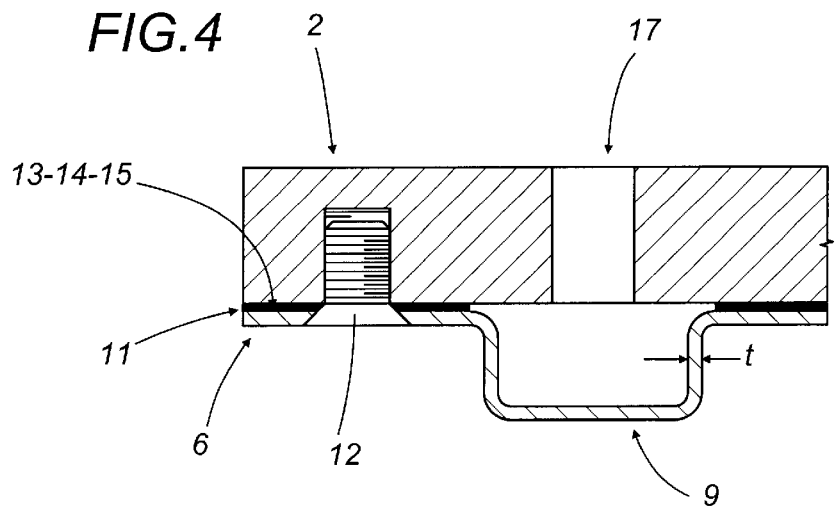
FIG. 4 illustrates a detail from FIG. 3.
Figure 5:
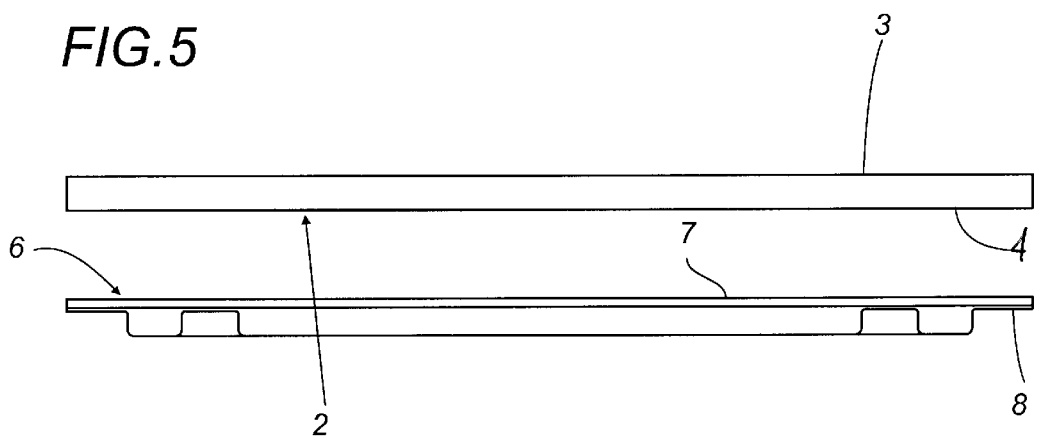
FIG. 5 illustrates in a front view the two main components of the device shown in FIG. 1.

The fluid-cooled heat sink and the process for making it according to the invention will now be described in further detail with reference to the accompanying drawings, which illustrate a preferred embodiment of the invention, without restricting the scope of the inventive concept.

The numeral 1 denotes a fluid-cooled heat sink for electronic components. The heat sink 1 comprises a thick metal plate 2 having a first face 3 and a second face 4. The plate 2 is associated, at the first face 3, to at least one electronic component 5 from which heat must be removed during operation. In a preferred embodiment which is illustrated, a large face of the electronic component 5 is joined to the first face 3 of the first metal plate 2.

The first metal plate 2 is machined only to finish the surface of the faces, when necessary. The finishing of the first face 3 reduces corrugation and surface roughness so as to make the contact surface between the first plate 2 and the electronic component 5 as smooth as possible, thus maximising the heat exchange between the two. The second face 4 may be machined if necessary, for example, to improve flatness or to make connections or to reduce the weight of the plate.

The heat sink 1 further comprises a second metal plate 6 also having a first face 7 and a second face 8. Advantageously, the material of which the second plate 6 is made and its thickness are such that the second plate can be plastically deformed. According to the present invention, the first face 7 of the second plate 6 has made in it a groove 9 for the passage of a cooling fluid 10, which may be a liquid, a gas or a vapour. Advantageously, the first face 7 and the second face 8 of the second plate 6 are parallel to each other at least at the groove 9. Thus, the thickness t of the plate 6 is substantially constant at least along the length of the groove 9 for the cooling fluid 10.

In a preferred embodiment, as shown in the drawings, the thickness t of the second plate 6 is substantially constant along the full length of the plate 6, any variations in the thickness being due solely to the plastic deformation of the material. The first face 7 of the second plate 6 is joined to the second face 4 of the first plate 2. Hence, the groove 9 faces the second face 4 of the first plate 2. Thus, the two plates 2, 6 form a path for the cooling fluid 10.

The path for the fluid is delimited by the groove 9 and by the portion of the second face 4 of the first plate 2 facing the groove 9. The cooling fluid 10 thus flows in contact with the first plate 2 and absorbs the heat which has been transferred to it from the electronic component 5 by conduction.

The two plates 2, 6 are attached to each other by suitable connection means 11. The connection means 11 used may be of any kind provided that they guarantee an effective seal preventing the escape of the cooling fluid 10 flowing in the groove 9. For this purpose, the connection means 11 may comprise screws 12 engaged in both plates 2, 6 to guarantee fixing and a fluid-tight seal 13 positioned between the two plates. Alternatively, the connection means 11 comprise a layer of glue 14 between the two plates 2, 6 or a layer of glue 14 and at least one screw 12. If the second plate 6 is also made of metal, the connection means 11 may consist of a welded or a high- or low-temperature brazed joint 15.

In a preferred embodiment, the first metal plate 2 further comprises at least one inlet through hole 16 to allow the cooling fluid to flow into the groove 9 and at least one outlet through hole 17 to allow the cooling fluid to flow out of the groove 9. Advantageously, the inlet and outlet holes are made in the first plate 2, which is thick, so as to enable pipe fittings (not illustrated) for the cooling fluid 10 to be mounted easily and securely.

The invention also provides a process for making a fluid-cooled heat sink 1 for electronic components. In particular, it provides a process for forming the groove 9 in the first face 7 of the second plate 6. The groove 9 is formed in the second plate 6 by plastic deformation. The first face 7 of the second plate 6 is thus formed in relief to make the cavity of the groove 9. In this way, the outside surface of the groove 9 protrudes from the second face 8 of the plate 6, opposite the first face 7. If the second plate 6 is made of metal, the groove 9 is made by die forming. The second plate 6 is placed on a die (not illustrated), whose shape, whether recessed or in relief, reproduces the contour of the groove 9. The second plate 6 is then pressed between the die and a mating die (not illustrated). The force of the two mating dies against each other gives the second plate 6 the desired shape. The die-forming process may be performed hot, preceeded by at least one heating step, or at ambient temperature.

Advantageously, if the second plate 6 is made of a plastic material, deformation is performed by thermoforming. This process consists in heating the second plate 6 to a temperature at which the plastic material of which the second plate 6 is made is in an elastoplastic state and making it adhere to a suitably shaped die (not illustrated), usually with the aid of a vacuum. Both of these plastic deformation processes, namely, die forming and thermoforming, are well known and will not be described in further detail. Next, the first face 7 of the second plate 6 is joined to the second face 4 of the first plate 2, in which the inlet hole 16 and the outlet hole 17 for the cooling fluid 10 have been made, in such a way that the two holes face the groove 9. If the second plate 6 is also made of metal, it is joined to the first plate 2 by brazing. Alternatively, the two plates 2, 6 may be glued together or joined by screws with an interposed seal.

The invention achieves important advantages. First of all, the fluid-cooled heat sink according to the invention is easy to make because the groove for the cooling fluid does not require any machining process involving stock removal on the product to be made. The process according to the invention therefore reduces significantly the amount of waste material. The groove is made by plastic deformation, and so swarf is minimized. In addition, the heat sink according to the invention lends itself to series production, thus reducing production costs. Once the dies for the different components have been made, the entire production process is very fast because forming the groove by die forming or thermoforming is quicker than making it by extrusion or by a machine process involving stock removal.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A fluid-cooled heat sink for electronic components, comprising:

a first metal plate having a first face and a second face, the first metal plate being associated to at least one electronic component at least along the first face;

a second plate having a first face and a second face, the first face of the second plate being joined to the second face of the first plate, said second plate having a thickness substantially less than the thickness of said first plate;

at least one groove for a cooling fluid defined in the first face of the second plate; and means of connection between the first plate and the second plate, the heat sink being characterized in that the first face and the second face of the second plate are substantially parallel to each other at least along the length of the groove.

2. The heat sink according to claim 1, characterized in that the connection means between the first plate and the second plate comprise at least a brazed joint between the two plates.

3. The heat sink according to claim 1, characterized in that the connection means between the first plate and the second plate comprise at least a welded joint between the two plates.

4. The heat sink according to claim 1, characterized in that the connection means between the first plate and the second plate comprise at least a layer of glue between the two plates.

5. The heat sink according to claim 1, characterized in that the connection means between the first plate and the second plate comprise at least one fastener and at least one seal.

6. The heat sink according to claim 1, characterized in that the first metal plate has at least one inlet through hole to allow the cooling fluid to flow into the groove, and at least one outlet through hole to allow the cooling fluid to flow out of the groove.

7. The heat sink according to claim 1, characterized in that the second plate is a metal plate.

8. The heat sink according to claim 1, characterized in that the second plate is a plate made of a plastic material.

9. A process for making a fluid-cooled heat sink for electronic components, comprising the following steps:

providing a first metal plate having a first face and a second face;

providing a second metal plate having a first face and a second face, said second plate having a thickness substantially less than the thickness of said first plate;

defining in the second plate a groove through which a cooling fluid can pass;

joining the first face of the second plate to the second face of the first plate in such a way that the groove faces the first plate, the process being characterized in that the step of forming the groove consists in forming the groove on the second plate by plastic deformation; and forming at least two through holes in the first plate to form the inlet and the outlet of the groove.

10. The process according to claim 9, characterized in that the groove is defined in relief on the second plate.

11. The process according to claim 9, characterized in that the step of defining the groove on in the second plate comprises the step of die forming the groove on the second plate.

12. The process according to claim 9, characterized in that the step of defining the groove on the second plate comprises the step of thermoforming the groove on the second plate.

13. The process according to claim 9, characterized in that the step of joining the second plate to the first plate comprising the step of brazing the first plate to the second plate.

14. The process according to claim 9, characterized in that the step of joining the second plate to the first plate comprises the step of gluing the second plate to the first plate.

15. The process according to claim 9, characterized in that the step of joining the second plate to the first plate comprises the following further steps:

placing at least one seal between the first plate and the second plate; and attaching the first and second plates to each other using at least one screw.

16. The process according to claim from 9, further comprising the step of finishing the first plate at least on its first face to flatten the first face of the first plate guarantees maximum contact between the two for increasing surface contact between the electronic component and the first face of the first plate.

* * * * *